(12) United States Patent
Nelson et al.

(10) Patent No.: US 7,079,778 B1
(45) Date of Patent: Jul. 18, 2006

(54) RUGGED SHOCK-RESISTANT BACKPLANE FOR EMBEDDED SYSTEMS

(75) Inventors: Shannon Mary Nelson, Chicago, IL (US); Richard Joseph Paul, Bartlett, IL (US); Mark D. Hischke, Algonquin, IL (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 09/544,762

(22) Filed: Apr. 7, 2000

(51) Int. Cl.
*H04B 10/00* (2006.01)

(52) U.S. Cl. ............... 398/164; 398/128; 398/130; 398/135; 398/138

(58) Field of Classification Search ............... 359/152, 359/154, 159, 163, 172; 398/135, 138, 160, 398/164, 128, 130, 140
See application file for complete search history.

(56) References Cited

U.S. PATENT DOCUMENTS

| | | | | |
|---|---|---|---|---|
| 3,858,154 A | * | 12/1974 | Reimer | 439/66 |
| 4,063,083 A | * | 12/1977 | Cathey et al. | 398/164 |
| 4,545,023 A | * | 10/1985 | Mizzi | 708/143 |
| 4,751,479 A | | 6/1988 | Parr | |
| 4,790,762 A | | 12/1988 | Harms et al. | |
| 4,829,596 A | * | 5/1989 | Barina | 455/612 |
| 4,850,044 A | * | 7/1989 | Block et al. | 398/118 |
| 5,269,707 A | * | 12/1993 | Reichardt et al. | 439/630 |
| 5,280,184 A | * | 1/1994 | Jokerst et al. | 257/82 |
| 5,309,315 A | | 5/1994 | Naedel et al. | |
| 5,343,361 A | | 8/1994 | Rudy, Jr. et al. | |
| 5,348,482 A | | 9/1994 | Rudy, Jr. et al. | |
| 5,376,011 A | | 12/1994 | Rudy, Jr. et al. | |
| 5,381,314 A | | 1/1995 | Rudy, Jr. et al. | |
| 5,388,995 A | | 2/1995 | Rudy, Jr. et al. | |
| 5,428,507 A | | 6/1995 | Chatel et al. | |
| 5,430,615 A | | 7/1995 | Keeth et al. | |
| 5,546,211 A | | 8/1996 | Devon | |
| 5,570,270 A | | 10/1996 | Naedel et al. | |
| 5,611,022 A | * | 3/1997 | Estrada et al. | 358/1.9 |
| 5,617,236 A | | 4/1997 | Wang et al. | |
| 5,726,786 A | * | 3/1998 | Heflinger | 398/128 |
| 5,737,107 A | | 4/1998 | Umeda | |
| 5,737,690 A | | 4/1998 | Gutman | |
| 5,783,777 A | | 7/1998 | Kruse et al. | |
| 5,794,164 A | | 8/1998 | Beckert et al. | |
| 5,815,298 A | * | 9/1998 | Cern | 359/152 |
| 5,818,984 A | * | 10/1998 | Ahmad et al. | 385/14 |
| 5,847,507 A | * | 12/1998 | Butterworth et al. | 313/512 |
| 5,850,189 A | | 12/1998 | Sakanaka et al. | |

(Continued)

FOREIGN PATENT DOCUMENTS

JP          10-285115        * 10/1998

*Primary Examiner*—M. R. Sedighian
(74) *Attorney, Agent, or Firm*—Stetina Brunda Garred & Brucker

(57) ABSTRACT

Infrared communications scheme for use in an embedded system. According to a preferred embodiment, the invention comprises the use of an infrared communications scheme, according to IrDA protocol, which is utilized to transmit and receive data optically between circuit cards housed within an enclosed, embedded system. Preferably, each respective circuit card is provided with an LED and photodiode to respectively transmit and receive data optically. As such, wire connections are eliminated and allows the systems and methods of the present invention to withstand a greater degree of vibration and shock than that of the prior-art systems and methods. Moreover, the systems and methods of the present invention provide increased reliability and provide greater electrical isolation between modules than prior-art systems and methods.

15 Claims, 2 Drawing Sheets

U.S. PATENT DOCUMENTS

| | | |
|---|---|---|
| 5,852,517 A | 12/1998 | Gerber et al. |
| 5,863,211 A | 1/1999 | Sobotta et al. |
| 5,864,708 A * | 1/1999 | Croft et al. .................. 395/821 |
| 5,923,451 A * | 7/1999 | Karstensen et al. .......... 359/163 |
| 5,949,565 A * | 9/1999 | Ishida ........................ 359/154 |
| 5,986,785 A * | 11/1999 | Kobayashi .................. 359/152 |
| 6,023,147 A * | 2/2000 | Cargin et al. ................ 320/114 |
| 6,038,355 A * | 3/2000 | Bishop ......................... 385/14 |
| 6,160,653 A * | 12/2000 | Davidson .................... 359/163 |
| 6,256,129 B1 * | 7/2001 | Kim et al. ................... 359/159 |
| 6,310,992 B1 * | 10/2001 | Gehrke et al. ................ 385/24 |
| 6,317,242 B1 * | 11/2001 | Ozeki et al. ................ 359/163 |
| 6,438,684 B1 * | 8/2002 | Mitchell et al. ............... 713/1 |
| 6,650,844 B1 * | 11/2003 | Davies et al. ............... 398/164 |
| 6,901,221 B1 * | 5/2005 | Jiang et al. .................. 398/138 |
| 2004/0187766 A1 * | 9/2004 | Letertre ........................ 117/11 |

\* cited by examiner

RUGGED SHOCK-RESISTANT BACKPLANE FOR EMBEDDED SYSTEMS

STATEMENT RE: FEDERALLY SPONSORED RESEARCH/DEVELOPMENT

Statement of Government Rights

This invention was made with Government Support under contract N66001-98-C-8518 awarded by the United States Navy. The Government has certain rights in this invention.

CROSS-REFERENCE TO RELATED APPLICATIONS (Not Applicable)

BACKGROUND OF THE INVENTION

Embedded or enclosed systems for housing electronic components, such as a computer chassis, that are designed to withstand high shock and vibration are well-known in the art. Exemplary of such prior-art enclosures include those environmental enclosures disclosed in U.S. Pat. Nos. 5,309,315 and 5,570,270, issued on May 3, 1994 and Oct. 29, 1996, respectively, to Nadell et al., entitled SEVERE ENVIRONMENT ENCLOSURE WITH THERMAL HEAT SINK AND EMI PROTECTION, the teachings of which are expressly incorporated herein by reference. Additionally exemplary of such prior-art apparatus include those enclosures disclosed in U.S. Pat. No. 5,381,314 issued on Jan. 10, 1995 to Rudy, Jr. et al., entitled HEAT DISSIPATING EMI/RFI PROTECTIVE FUNCTION BOX, the teachings of which are likewise incorporated herein by reference.

In this regard, such devices are typically designed to house computer systems for use in predominantly embedded applications in severe environments. With respect to the latter, it is well-recognized in the art that a severe environment is generally defined as one subject to large environmental extremes due to temperature, humidity, radiation, electromagnetic induction, shock and vibration. Additionally, an embedded application is generally accepted as meaning a specific function or functions, which are contained within a larger application, and requires no human intervention beyond supplying power to the computer. Exemplary of such embedded applications include systems and process controls, communications, navigations, and surveillance.

In order to properly function and perform such applications, it is critical that the computer and other electronic components housed within such enclosures be constructed, supported and enclosed in such a way as to be able to withstand such severe conditions. Typically, the primary focus of such prior-art enclosures is to provide a structurally sound enclosure for an array of individual circuit boards or daughter cards in a backplane assembly to which the circuit boards are electrically connectable and disconnectable, to thus define a card cage. Despite the best efforts that can be made with respect to properly arranging such circuit cards, however, an inherent problem in all such embedded systems arises from the use of wiring between circuit cards, which is necessary to interconnect such circuit cards for data transfer. Specifically, hard-wired connections are known to become disconnected when subjected to extremes in shock and vibration. The use of wire conductor for interconnecting circuit cards also typically generates undesirable electromagnetic interference (EMI) and radio frequency interference (RFI).

In addition to the undesirable effects and potentially unsound structural arrangement by which prior-art circuit cards are housed interconnected within an embedded system are the complications that arise from designing such systems. As it is well-known in the art, circuit cards can and oftentimes do operate at multiple voltages, which thus requires complex circuitry design in order to enable a plurality of circuit cards to be interconnected with one another. In this respect, to the extent fluctuating voltages are utilized in a given interconnected system, those circuit cards incapable of operating at such higher voltages become inoperative due to the incompatible voltage interface.

As such, there is a substantial need in the art for a system and method for operatively interconnecting a plurality of circuit cards with one another within an embedded system that can withstand severe environments to a greater degree than prior art system and methods. Likewise, there is a substantial need in the art for such systems and methods that can produce greater reliability, can be implemented utilizing existing technology, and allows for substantially more simplified circuitry design than prior art systems and methods.

BRIEF SUMMARY OF THE INVENTION

The present invention specifically addresses and alleviates the above-identified deficiencies in the art. In this regard, the present invention is directed to systems and methods for interconnecting a plurality of modules, namely circuit boards or daughter cards, in an embedded environment that have increased reliability, can withstand shock and vibration, and provide greater electrical isolation between such modules than prior art methods and systems.

In a preferred embodiment, the system comprises the use of a standardized infrared communication scheme, and in particular one or more schemes developed by the Infrared Data Association, or IrDA, to optically transmit and receive data between modules. In this regard, each respective one of a plurality of modules comprising an embedded computer system is provided with an LED and photodiode to optically transmit and receive signals to thus provide a wireless connection between such modules. Due to the fact that such infrared communications schemes typically use air as a transmission medium, there is thus provided superior electrical isolation and reduced heat dissemination between modules. Additionally, because wiring connections need not be formed, the systems and methods of the present invention are able to mitigate damage imparted by the shock transferred from circuit card to circuit card insofar as such physical activity is known in the art to cause prior art wire connections to break or otherwise become defective. Moreover, by utilizing infrared communication schemes, the systems and methods of the present invention can transmit data at high speed, which are currently known in the art to function at 4 Mbps (megabits per second), and may eventually exceed 16 megabits per second.

It is therefore an object of the present invention to provide a system and method for electrically interconnecting a plurality of circuit cards with one another within an embedded system that can withstand severe environments to a greater degree than prior art system and methods.

Another object of the present invention is to provide a system and method for operatively interconnecting a plurality of circuit cards with one another with an embedded system that, in addition to being able to withstand severe environmental conditions, further provides electrical isolation between modules or circuits than prior art systems and methods.

Another object of the present invention is to provide a system and method for operatively interconnecting a plurality of circuit cards with one another within an embedded system that has greater reliability than prior-art systems and methods, particularly with respect to performing data transfer functions.

Another object of the present invention is to provide a system and method for operatively interconnecting a plurality of circuit cards with one another within an embedded system that are operative to facilitate high speed communication between system modules or circuit cards contained within such system.

Still further objects of the present invention are to provide a system and method for operatively interconnecting a plurality of circuit cards with one another within an embedded system that is of simple and durable construction, relatively inexpensive to design and fabricate, may be readily designed and implemented using conventional technology, and is more effective and efficient than prior art systems and methods.

BRIEF DESCRIPTION OF THE SEVERAL VIEWS OF THE DRAWING

These, as well as other features of the present invention, will become more apparent upon reference to the drawings, wherein.

DETAILED DESCRIPTION OF THE PRESENT EMBODIMENT

The detailed description as set forth below in connection with the appended drawings is intended as a description of the presently preferred embodiments of the invention, and is not intended to represent the only form in which the present invention may be constructed or utilized. The description sets forth the functions and sequences of steps for constructing and operating the invention in connection with the illustrated embodiments. It is understood, however, that the same or equivalent functions and sequences may be accomplished by different embodiments and that they are also intended to be encompassed within the scope of this invention.

Figure 1:
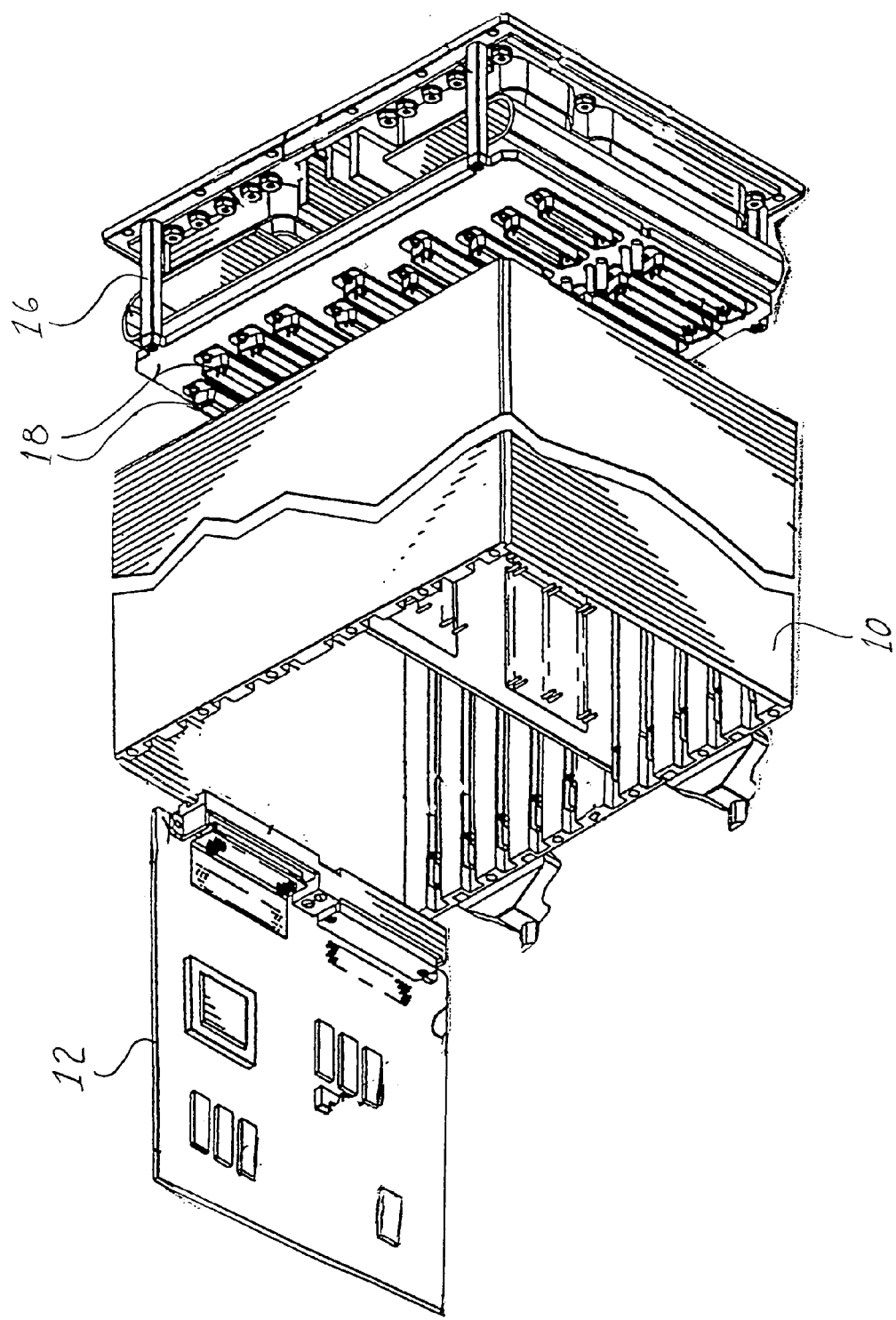
FIG. 1 is an exploded view of an enclosure depicting a circuit card positionable therewithin.

Referring now to the figures, initially to FIG. 1, there is shown an exploded view of an environment enclosure 10 for housing a computer system for use in running embedded applications in severe environments. As is well-known to those skilled in the art, such enclosures 10 are capable of withstanding extreme environmental conditions, such as maximum extremes of shock, vibration, temperature, EMI, humidity, as well as sand, dust, and the like. Such containers are particularly effective in running embedded applications, which are defined as a specific function which is contained within a larger application requiring no human intervention beyond supplying power to the computer (not shown) housed therewithin. For example, embedded applications include but not limited to, systems and process control, communications, navigation, and surveillance.

The computer systems utilized to run such application typically comprise a plurality of circuit boards or daughter cards, such as 12, that are affixed about a backplane 16 rigidly mounted within the enclosure. In this respect, the backplane is provided with a plurality of connectors 18 for supporting a plurality of circuit cards in generally parallel, upright relationship. The backplane 16 also supports the power supply (not shown), which is typically located within such enclosure 10, to thus provide power for the computer system to function.

In prior art systems, the circuit cards are typically hard wired to one another to enable data to be transmitted and received therebetween. The use of hard-wire electric connections, however, is known to have several drawbacks. In this regard, hard wiring is known to be unreliable, particularly when subjected to severe shock and vibration insofar as such forces cause the wire connections between circuit cards to break. Moreover, hard wiring creates undesirable EMI and RFI that can interfere with computer operations. Moreover, because the various circuit cards deployed in such enclosed computer systems often operate at different voltages, hard wiring creates significant design problems insofar as painstaking efforts must be made to ensure that the voltage by which each of the circuit cards functions does not exceed operative levels, while at the same time being sufficient to run desired applications.

To address such problems, there is provided herein a novel communications scheme by which circuit cards can be interconnected to one another to transmit and receive data that eliminates the foregoing drawbacks. In this respect, there is provided herein an infrared communications scheme that interconnects the plurality of circuit cards of an embedded computer system to thus enable data to be received and transmitted optically therebetween. In particular, each respective one of the plurality of the circuit cards is provided with a dedicated LED and photodiode pair that enables data signals to be transmitted typically through air, as opposed to a hard wire connection.

The infrared communications scheme utilized in the present invention may take any of a variety of the standard infrared protocols developed by the Infrared Data Association, also known as IrDA. As is well-known to those skilled in the art, the IrDA has created interoperable, low-cost infrared data interconnection standards that support a broad range of applications for use in computing and communications devices. Advantageously, IrDA standards are ideally recommended for high speed, short range, line of sight, point-to-point cordless data transfer, which are typically utilized in widespread commercial applications for personal computers, digital cameras, hand-held data collection devices, and the like. A more detailed outline of the standards and protocols designed and developed by the IrDA may obtained from the Infrared Data Association based in Walnut Creek, Calif. Alternatively, such data may be obtained via the IrDA's website at http:\\www.irda.org\standards\standards.asp, the teachings of which are expressly incorporated herein by reference.

As will be appreciated by those skilled in the art, the use of standardized IrDA infrared communications schemes currently can enable data to be received and transmitted at rates up to four megabits per second (4 Mbps), which is substantially equivalent, if not faster, than conventional hard-wired systems. It is further contemplated that developments may soon be made which can support data transfer rates in excess of sixteen megabits per second (16 Mbps).

As will further be appreciated by those skilled in the art, by virtue of the fact that infrared communications schemes enable data to be transmitted and received optically, the need for hard-wire connections will thus be eliminated. As such, the systems and methods of the present invention have substantially increased reliability as compared to conventional hard-wire connections, which are known to deteriorate and eventually become disconnected when subjected to high shock or vibrational activity. Moreover, because the transmission medium for infrared communications system typically is air, there is thus provided greater electrical isolation, namely shielding from EMI and RFI, that cannot otherwise be provided via hard-wire connections.

Given the widespread availability of IrDA standards and protocols, it will be readily appreciated by those skilled in the art that a variety of LED and photodiode arrangements are already commercially available that may be implemented to facilitate the transfer of data amongst circuit cards. As such, one skilled in the art would easily be able to pick and choose which particular IrDA infrared communication scheme may be appropriate for a given application. Advantageously, because of the fact that such infrared communication schemes transmit data optically typically through air, designers and engineers need not make appropriate adjustments in the various voltages at which differing circuit cards operate, which thus enables systems to be designed and implemented in a far easier manner than conventional embedded systems using hard-wire connections.

Figure 2:
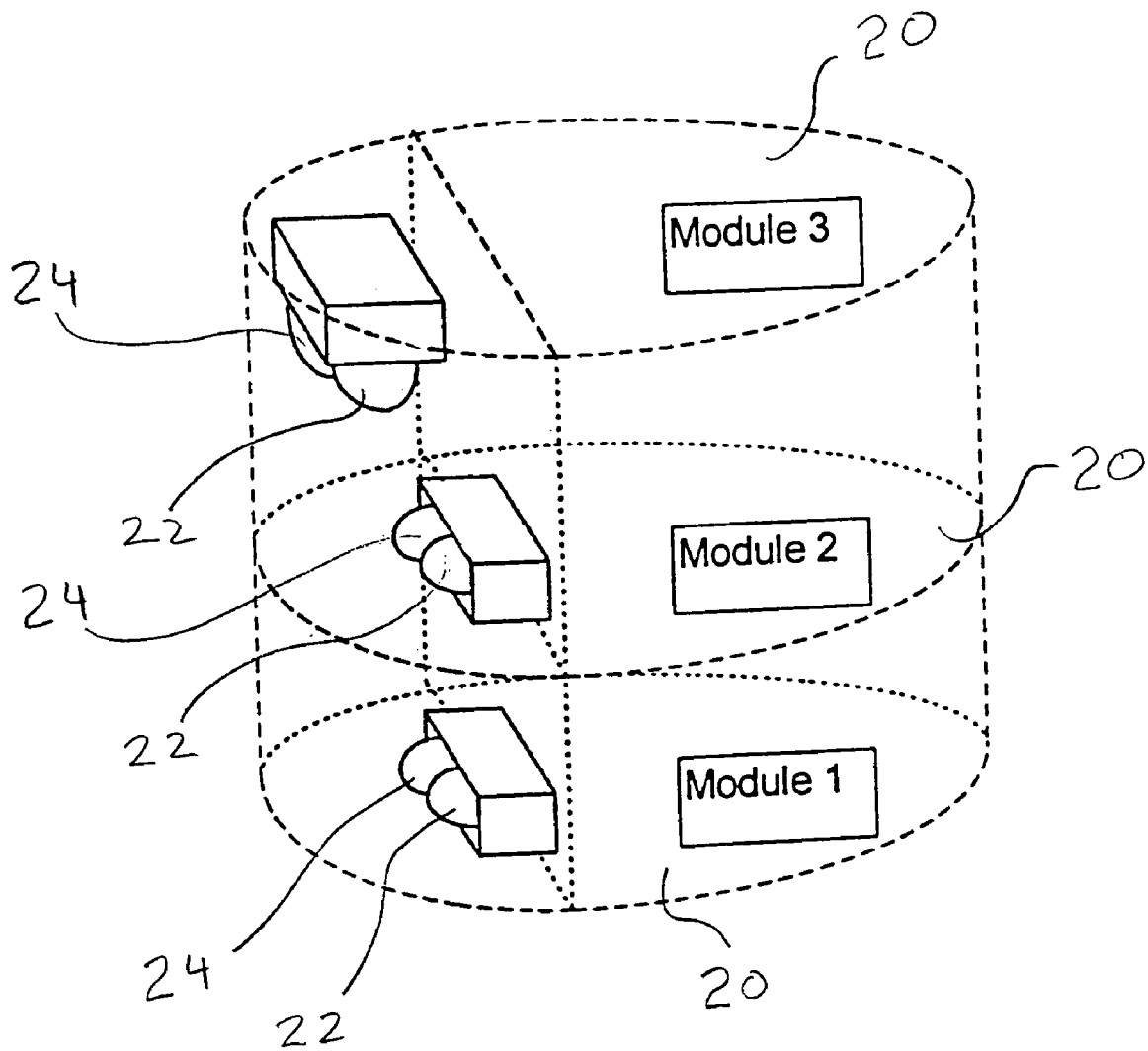
FIG. 2 is a perspective, partial cross-sectional view of a plurality of modules of an embedded computer system having dedicated pairs of LED and photodiodes formed thereon for transmitting and receiving data between said modules.

FIG. 2 depicts an example of how one such possible physical implementation of an IrDA infrared communications scheme may be implemented according to a preferred embodiment of the present invention. As illustrated, multiple modules 20 representing circuit boards, daughter cards, and the like, having dedicated pairs of LEDs 22 and photodiodes 24 formed thereon, are arranged such that the same are optically operative to transmit and receive data from one another. In this respect, so long as an optical pathway can be established between the respective LED and photodiodes 22, 24 of each respective module 20, the ability of each respective module 20 to interconnect with one another will be maintained. Indeed, it will be recognized by those skilled in the art that the use of LEDs and photodiodes in transmitting data optically provides for a broader range of coverage and can thus withstand stresses and strains in the underlying backplane structure than would conventional wiring schemes utilized with embedded computer systems.

It is to be further understood that various additions, deletions, modifications and alterations may be made to the above-described embodiments without departing from the intended spirit and scope of the present invention. Accordingly, it is intended that all such additions, deletions, modifications and alterations be included within the scope of the following claims.

The invention claimed is:

1. A shock-resistant system for operatively interconnecting circuit cards within a computer system to enable data to be transmitted and received therebetween comprising:
   a) a common backplane having a plurality of circuit card connectors disposed in spaced apart relation thereon for supporting circuit cards in a generally upright parallel relationship;
   b) a plurality of circuit cards, each of said circuit cards being mounted to one of said circuit card connectors, each of said circuit cards having a transmitter LED and a receiver photodiode formed thereon;
   c) a plurality of optical pathways formed solely through air between said circuit cards, the optical pathways forming a plurality of independent optical connections between said transmitter LED on at least one of said circuit cards and said receiver photodiodes on any two of said circuit cards; and
   d) wherein said circuit cards are maintained in fixed relationship to one another via said common backplane to maintain continuous optical intercard communications between each of said circuit cards such that the LED on each circuit card is operative to generate and transmit a signal, and the photodiode of one corresponding circuit card is operative to receive the signal through the corresponding optical pathway.

2. The system of claim 1 wherein said signals generated by said transmitter LEDs and received by said photodiodes comprise optically transmitted infrared radiation.

3. The system of claim 2 wherein said transmission and reception of signals between said transmitter LEDs and said receiver photodiodes comprise a standardized infrared communications scheme protocol.

4. The system of claim 3 wherein said infrared communications scheme protocol comprises a protocol developed by the Infrared Data Association.

5. The system of claim 1 wherein said circuit cards are housed within an enclosure.

6. The system of claim 1 wherein said circuit cards are operative to run an embedded application.

7. A method for operatively interconnecting circuit cards within a computer to enable data to be transmitted and received therebetween comprising:
   a) forming a common backplane having a plurality of circuit card connectors disposed in spaced apart relation thereon for supporting circuit cards in a generally parallel upright relationship;
   b) providing a plurality of circuit cards each having a transmitter LED diode and a receiver photodiode formed thereon;
   c) mounting each of said circuit cards to one corresponding circuit card connector to establish a plurality of optical pathways between the LED diodes and the photodiodes of the corresponding circuit cards, such that a plurality of independent optical connections between the circuit cards are formed solely through air;
   d) generating and transmitting a light from at least one of the LED diode, the light generated from the LED carrying data to be transmitted from the circuit card on which the at least one LED diode is formed;
   e) receiving the light by the photodiodes formed on any two of the circuit cards, so as to receive the data carried by the light.

8. The method of claim 7 wherein in steps d) and e), said light generated by said LED and received by said photodiode comprise optically transmitted infrared radiation.

9. The method of claim 7 wherein in the light transmitted from said LED to said photodiode comprise a standardized infrared communications scheme protocol.

10. The method of claim 9 wherein said infrared communications scheme protocol comprises a protocol developed by the Infrared Data Association.

11. The method of claim 9 wherein said circuit cards are operative to run an embedded application.

12. The method of claim 7 wherein said circuit cards are operative to run an embedded application.

13. A shock-resistant system for operatively interconnecting circuit cards within a computer system to enable data to be transmitted and received therebetween comprising:
   a) a common backplane having a plurality of circuit card connectors disposed in spaced apart relation thereon for supporting circuit cards extending normal to the backplane in a generally upright parallel relationship;

b) at least first, second, and third circuit cards, pairs of first, second and third LEDs and photodiodes formed thereon, respectively, the first, second and third LED being operative to generate and transmit infrared signals which carry data to be transmitted from the first, second and third circuit cards, respectively, and the first, second and third photodiodes being operative to receive the infrared signal generated by the first, second and third LEDs;

c) first and second optical pathways formed between the first LED with the second and third photodiodes, third and fourth optical pathways formed between the second LED with the first and third photodiodes, and fifth and sixth optical pathways formed between the third LED and the first and second photodiodes; and d) wherein the first, second and third circuit cards are maintained in fixed relationship to one another, and the infrared signals are transmitted along the first, second, third, fourth, fifth and sixth optical pathways independently with each other.

14. The system of claim 13, wherein the computer system includes a digital camera or a hand-held data collection device.

15. The system of claim 13, wherein the infrared signal comprises a standardized infrared communication scheme protocol.

* * * * *